United States Patent
Chen et al.

(10) Patent No.: US 9,748,304 B2
(45) Date of Patent: Aug. 29, 2017

(54) IMAGE SENSOR DEVICES, METHODS OF MANUFACTURE THEREOF, AND SEMICONDUCTOR DEVICE MANUFACTURING METHODS

(71) Applicant: Taiwan Semiconductor Manufacturing Company, Ltd., Hsin-Chu (TW)

(72) Inventors: U-Ting Chen, Wanluan Township (TW); Shu-Ting Tsai, Kaohsiung (TW); Szu-Ying Chen, Toufen Township (TW); Jeng-Shyan Lin, Tainan (TW); Dun-Nian Yaung, Taipei (TW); Jen-Cheng Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 131 days.

(21) Appl. No.: 14/133,387

(22) Filed: Dec. 18, 2013

(65) Prior Publication Data

US 2015/0171132 A1  Jun. 18, 2015

(51) Int. Cl.
*H01L 31/00* (2006.01)
*H01L 27/146* (2006.01)
(Continued)

(52) U.S. Cl.
CPC .. *H01L 27/14645* (2013.01); *H01L 21/76898* (2013.01); *H01L 23/481* (2013.01); *H01L 25/00* (2013.01); *H01L 25/50* (2013.01); *H01L 27/0688* (2013.01); *H01L 27/1464* (2013.01); *H01L 27/14621* (2013.01); *H01L 27/14636* (2013.01); *H01L 27/14685* (2013.01); *H01L 27/14687* (2013.01); *H01L 27/14689* (2013.01); *H01L 27/281* (2013.01); *H01L 31/1876* (2013.01); *H01L 21/76805* (2013.01); *H01L 21/76807* (2013.01); *H01L 2224/08145* (2013.01); *H01L 2224/80894* (2013.01);
(Continued)

(58) Field of Classification Search
CPC ............... H01L 21/76251; H01L 21/76254
USPC ........................................ 257/459
See application file for complete search history.

(56) References Cited

U.S. PATENT DOCUMENTS 4,959,705 A * 9/1990 Lemnios ............... H01L 27/118
257/276
5,208,726 A * 5/1993 Apel ...................... H01L 28/40
257/276

(Continued)

FOREIGN PATENT DOCUMENTS

CN 103426892 A 12/2013
KR 20120010120 A 2/2012

(Continued)

*Primary Examiner* — Sitaramarao S Yechuri
(74) *Attorney, Agent, or Firm* — Slater Matsil, LLP (57) ABSTRACT

Image sensor devices, methods of manufacture thereof, and semiconductor device manufacturing methods are disclosed. In some embodiments, a method of manufacturing a semiconductor device includes bonding a first semiconductor wafer to a second semiconductor wafer, the first semiconductor wafer comprising a substrate and an interconnect structure coupled to the substrate. The method includes removing a portion of the substrate from the first semiconductor wafer to expose a portion of the interconnect structure.

18 Claims, 5 Drawing Sheets

(51) Int. Cl.
*H01L 25/00* (2006.01)
*H01L 27/06* (2006.01)
*H01L 21/768* (2006.01)
*H01L 27/28* (2006.01)
*H01L 23/48* (2006.01)
*H01L 31/18* (2006.01)

(52) U.S. Cl.
CPC ........... *H01L 2224/80895* (2013.01); *H01L 2224/80896* (2013.01); *H01L 2224/9202* (2013.01); *H01L 2224/94* (2013.01); *H01L 2225/06513* (2013.01); *H01L 2225/06541* (2013.01)

(56) References Cited

U.S. PATENT DOCUMENTS

| | | | | |
|---|---|---|---|---|
| 5,532,506 | A * | 7/1996 | Tserng | H01L 23/3672 257/276 |
| 6,081,006 | A * | 6/2000 | Nelson | H01L 23/481 257/276 |
| 6,391,770 | B2 * | 5/2002 | Kosaki | H01L 21/76838 257/E21.597 |
| 7,005,721 | B2 * | 2/2006 | Nishijima | H01L 23/5223 257/531 |
| 7,355,273 | B2 * | 4/2008 | Jackson | H01L 21/76898 257/686 |
| 8,067,840 | B2 * | 11/2011 | Bielen | H01L 23/147 257/758 |
| 2008/0246152 | A1 * | 10/2008 | Liu | H01L 24/05 257/758 |
| 2009/0020842 | A1 * | 1/2009 | Shiau | H01L 21/76898 257/459 |
| 2009/0224388 | A1 * | 9/2009 | Bernstein | H01L 25/0652 257/686 |
| 2010/0184246 | A1 * | 7/2010 | Sakai | 438/60 |
| 2010/0213560 | A1 * | 8/2010 | Wang | H01L 27/14621 257/432 |
| 2011/0024866 | A1 * | 2/2011 | Tseng et al. | 257/459 |
| 2011/0024867 | A1 * | 2/2011 | Tseng et al. | 257/459 |
| 2011/0084365 | A1 * | 4/2011 | Law | H01L 24/05 257/621 |
| 2011/0156197 | A1 * | 6/2011 | Tivarus | H01L 27/14634 257/444 |
| 2011/0171582 | A1 | 7/2011 | Farooq et al. | |
| 2011/0304003 | A1 * | 12/2011 | Tanida et al. | 257/447 |
| 2012/0074593 | A1 * | 3/2012 | Wu | 257/777 |
| 2012/0156823 | A1 * | 6/2012 | Myung | H01L 21/78 438/65 |
| 2012/0205769 | A1 * | 8/2012 | Tsai | H01L 27/1464 257/460 |
| 2012/0217600 | A1 * | 8/2012 | Hongo et al. | 257/432 |
| 2013/0113065 | A1 * | 5/2013 | Qian | H01L 27/14636 257/437 |
| 2013/0277789 | A1 | 10/2013 | Chen et al. | |
| 2013/0307103 | A1 | 11/2013 | Lin et al. | |
| 2014/0124889 | A1 * | 5/2014 | Qian | H01L 27/14618 257/448 |

FOREIGN PATENT DOCUMENTS

KR 20130117329 A 10/2013
SG 177817 A1 2/2012

* cited by examiner

IMAGE SENSOR DEVICES, METHODS OF MANUFACTURE THEREOF, AND SEMICONDUCTOR DEVICE MANUFACTURING METHODS

CROSS-REFERENCE TO RELATED APPLICATIONS

This application relates to the following co-pending and commonly assigned patent application Ser. No. 13/839,860, filed on Mar. 15, 2013, entitled, "Interconnect Structure and Method," which application is hereby incorporated herein by reference in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, in other types of packaging, or used directly in an end application, for example.

Integrated circuit dies are typically formed on a front side of semiconductor wafers. The integrated circuit dies may comprise various electronic components, such as transistors, diodes, resistors, capacitors, and other devices. The integrated circuit dies may comprise various functions, such as logic, memory, processors, and/or other functions.

Complementary metal oxide semiconductor (CMOS) image sensor (CIS) devices are semiconductor devices that are used in some cameras, cell phones, and other devices for capturing images. Back side illumination (BSI) image sensors are CIS devices in which light enters from a back side of a substrate, rather than a front side. BSI sensors are capable of capturing more of an image signal than front side illumination image sensors due to reduced reflection of light, in some applications.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to semiconductor device and image sensor device manufacturing methods. Novel image sensor devices, semiconductor devices, and manufacturing methods thereof will be described herein.

Figure 1:
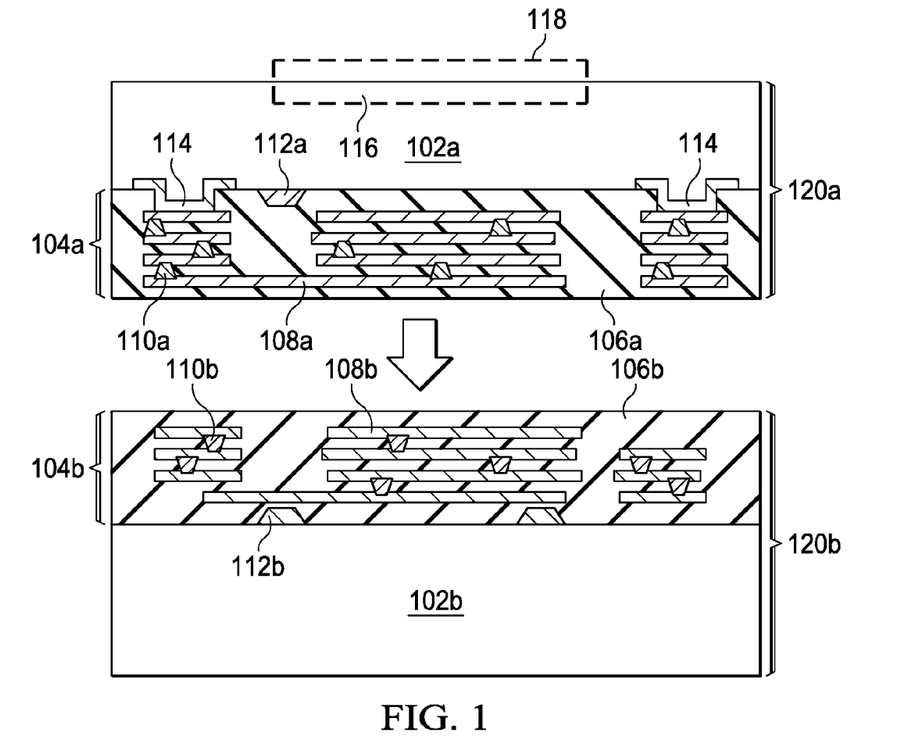
FIG. 1 shows a cross-sectional view of two semiconductor wafers being bonded together in accordance with some embodiments of the present disclosure.

Referring first to FIG. 1, there is shown a cross-sectional view of two semiconductor wafers 120a and 120b being bonded together in accordance with some embodiments of the present disclosure. A first semiconductor wafer 120a is bonded to a second semiconductor wafer 120b using a wafer bonding technique in accordance with some embodiments to manufacture a semiconductor device 100 (see FIG. 2). The first semiconductor wafer 120a and second semiconductor wafer 120b are bonded and processed using the methods to be described herein. A plurality of semiconductor devices 100 is formed from the first semiconductor wafer 120a and second semiconductor wafer 120b, and the first semiconductor wafer 120a and second semiconductor wafer 120b are then singulated along a scribe line region to separate the semiconductor devices 100 from the wafers. However, in the some of the drawings of the present disclosure, only one semiconductor device 100 is shown that include portions of the semiconductor wafers 120a and 120b that comprise semiconductor chips 120a and 120b that comprised a part of the semiconductor wafer 120a and 120b prior to the singulation process. Thus, element number 120a is used herein to refer to a first semiconductor wafer or a first semiconductor chip, and element number 120b is used herein to refer to a second semiconductor wafer or a second semiconductor chip.

Referring again to FIG. 1, first, the first semiconductor wafer 120a is provided. The first semiconductor wafer 120a comprises a substrate 102a and an interconnect structure 104a disposed over the substrate 102a. The substrate 102a may include a semiconductor substrate comprising silicon or other semiconductor materials and may be covered by an insulating layer, for example. The substrate 102a may include active components or circuits, not shown. The substrate 102a may comprise silicon oxide over single-crystal silicon, for example. The substrate 102a may include conductive layers or semiconductor elements, i.e., transistors, diodes, capacitors, resistors, inductors, etc. Compound semiconductors, GaAs, InP, Si/Ge, or SiC, as examples, may be used in place of silicon. The substrate 102a may comprise a silicon-on-insulator (SOI) or a germanium-on-insulator (GOI) substrate, as examples. The substrate 102a is also referred to herein as a first substrate 102a.

The interconnect structure 104a includes an inter-metal dielectric (IMD) 106a comprising a plurality of insulating material layers. The interconnect structure 104a and the IMD 106a are also referred to herein as a first interconnect structure 104a and a first IMD 106a, respectively. The IMD 106a includes a plurality of conductive lines 108a and a plurality of conductive vias 110a formed therein. The IMD 106a, conductive lines 108a, and conductive vias 110a provide electrical connections for the first semiconductor wafer 120a in a horizontal and vertical direction, for example. The insulating material layers of the IMD 106a may comprise silicon dioxide, silicon nitride, low dielectric constant (k) insulating materials having a dielectric constant or k value less than silicon dioxide (e.g., a k value of about 3.9 or less), extra-low k (ELK) dielectric materials having a k value of about 3.0 or less, or other types of materials, as examples.

The conductive lines 108a and conductive vias 110b may comprise materials such as Cu, Al, alloys thereof, other conductive materials, seed layers, barrier layers, or combinations or multiple layers thereof, as examples. A plurality of conductive features 112a that have a trapezoidal or other shape and comprising similar materials as described for the conductive lines 108a and conductive vias 110a may also be formed in the IMD 106a. Contact pads 114 are formed proximate a surface of the IMD 106a proximate or adjacent the first substrate 102a in some embodiments. The contact pads 114 may comprise Cu, Cu alloys, Al, or other conductive materials, as examples. The conductive lines 108a, conductive vias 110a, conductive features 112a, and contact pads 114 may be formed in the IMD 106a using damascene processes and/or subtractive etch techniques, as examples. Alternatively, the IMD 106a, conductive lines 108a, conductive vias 110a, conductive features 112a, and contact pads 114 may comprise other materials and may be formed using other methods.

A second semiconductor wafer 120b is provided. The second semiconductor wafer 120b also comprises a substrate 102b and an interconnect structure 104b coupled to the substrate 102b. The substrate 102b and the interconnect structure 104b are also referred to herein as a second substrate 102b and a second interconnect structure 104b. The interconnect structure 104b includes an IMD 106b which is also referred to herein as a second IMD 106b. The IMD 106b includes a plurality of conductive lines 108b, conductive vias 110b, and/or conductive features 112b formed therein in some embodiments. The substrate 102b, IMD 106b, conductive lines 108b, conductive vias 110b, and conductive features 112b may comprise similar materials and formation methods as described for the substrate 102a, IMD 106a, conductive lines 108a, conductive vias 110a, and conductive features 112a of the first semiconductor wafer 120a, for example.

In some embodiments, the second semiconductor wafer 120b is adapted to perform a different function than the first semiconductor wafer 120a, for example. In some embodiments, the first semiconductor wafer 120a comprises a sensor device, and the second semiconductor wafer 120b comprises an application specific integrated circuit (ASIC) device, as an example. The first semiconductor wafer 120a includes an array region 116 in some embodiments that includes an array of pixels formed within the substrate 102a, as shown in FIG. 1 in phantom (e.g., in dashed lines). In some embodiments, a color filter material/lens material 118 is formed over the array region 116. For example, a color filter material is formed the array of pixels in the array region 116, and a lens material is formed over the color filter material. The pixels in the array region 116 are adapted to sense images received. The color filter material is adapted to separate light to a red-green-blue (R, G, or B) original element when the semiconductor device 100 (not shown in FIG. 1; see FIG. 2) is utilized as a back side illumination (BSI) image sensor, for example. The color filter material comprises a photosensitive material in some embodiments, as another example. The lens material may comprise a micro-lens material in some embodiments, as an example. Alternatively, the color filter material and the lens material may comprise other materials. In some embodiments, the color filter material or the lens material, or the color filter and lens material 118 are not included, and the array region 116 may include other types of devices than pixels. The array region 116 is also referred to herein, e.g., in some of the claims, as a pixel array region 116.

Figure 2:
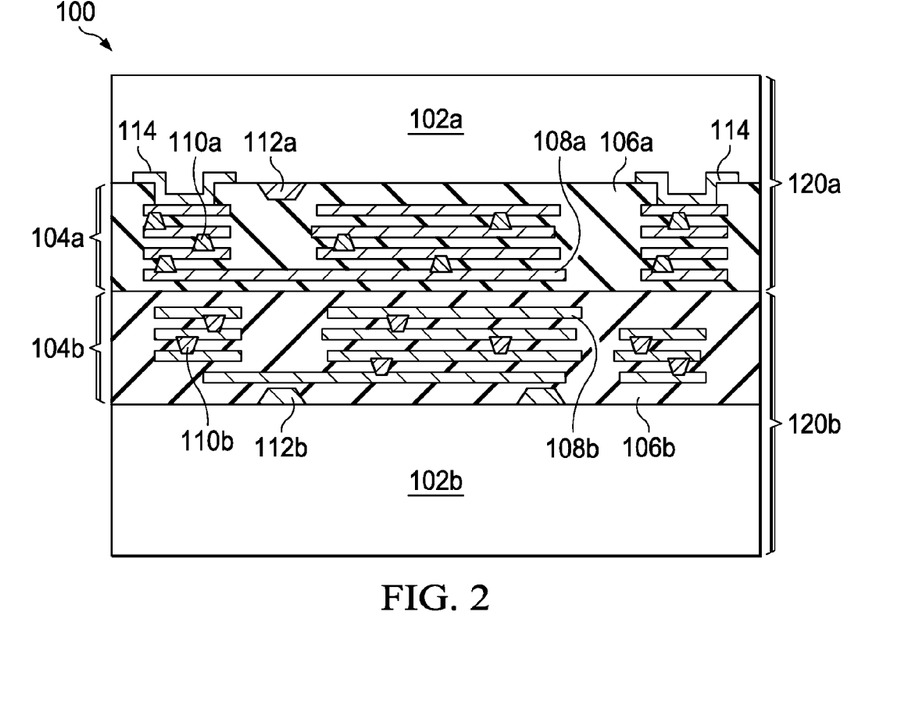
FIG. 2 is a cross-sectional view of a semiconductor device comprising the two semiconductor wafers after the bonding process in accordance with some embodiments.

The first semiconductor wafer 120a is inverted and bonded to the second semiconductor wafer 120b in some embodiments, as shown in FIGS. 1 and 2. The first interconnect structure 104a of the first semiconductor wafer 120a is bonded to the second interconnect structure 104b of the second semiconductor wafer 120b in some embodiments, for example. In some embodiments, the first IMD 106a of the first semiconductor wafer 120a is bonded to the second IMD 106b of the second semiconductor wafer 120b, for example.

The first semiconductor wafer 120a may be bonded to the second semiconductor wafer 120b using a suitable wafer bonding technique. The first semiconductor wafer 120a may be bonded to the second semiconductor wafer 120b using a dielectric-to-dielectric bond, a metal-to-metal bond, a metal-to-dielectric bond, or a combination thereof, for example. Some examples of commonly used bonding techniques for wafer bonding include direct bonding, chemically activated bonding, plasma activated bonding, anodic bonding, eutectic bonding, glass frit bonding, adhesive bonding, thermocompressive bonding, reactive bonding and/or the like. After the first semiconductor wafer 120a and the second semiconductor wafer 120b are bonded together, the interface between the first semiconductor wafer 120a and the second semiconductor wafer 120b may provide an electrically conductive path between the first semiconductor wafer 120a and the second semiconductor wafer 120b. In accordance with some embodiments, in a direct bonding process, the connection between the first semiconductor wafer 120a and the second semiconductor wafer 120b can be implemented using metal-to-metal bonding (e.g., copper-to-copper bonding), dielectric-to-dielectric bonding (e.g., oxide-to-oxide bonding), metal-to-dielectric bonding (e.g., oxide-to-copper bonding), any combinations thereof, and/or the like. In some embodiments, the first semiconductor wafer 120a and the second semiconductor wafer 120b are bonded together using a suitable metal-dielectric bonding technique such as a copper-silicon oxide nitride (Cu—SiON) bonding process, as another example.

FIG. 2 is a cross-sectional view of the semiconductor device 100 comprising the two semiconductor wafers 120a and 120b after the bonding process in accordance with some embodiments. The semiconductor device 100 comprises an image sensor device in some embodiments. The image sensor device may comprise a stacked complementary metal oxide semiconductor (CMOS) image sensor (CIS) device and/or a BSI image sensor device in accordance with some embodiments. Alternatively, the semiconductor device 100 may comprise other types of devices.

Because the first semiconductor wafer 120a is inverted before the bonding process in some embodiments, the conductive features 112a, conductive lines 108a, conductive vias 110a, and/or shallow trench isolation (STI) regions (not shown; STI regions may be formed in the substrate 102a, for example) in the first interconnect structure 104a may comprise an opposite shape from at least some of the conductive features 112b, conductive lines 108b, conductive vias 110b, and/or STI regions (also not shown; STI regions may be formed in the substrate 102b, for example) in the second interconnect structure 104b. As examples, the polygon-shaped conductive feature 112a comprises a mirrored shape yet is inverted from the polygon-shaped conductive feature 112b, and vias 110a comprise an inverted shape from vias 110b. In other embodiments, the first semiconductor wafer 120a may not be inverted before the bonding process, and the conductive features 112a, conductive lines 108a, conductive vias 110a, and/or STI regions in the first interconnect structure 104a comprise a similar shape and orientation relative to the shape of at least some of the conductive features 112b, conductive lines 108b, conductive vias 110b, and/or STI regions in the second interconnect structure 104b, for example, not shown.

The contact pads 114 may be substantially coplanar with the IMD 106a in some embodiments, as shown in FIG. 1. In other embodiments, the contact pads 114 may comprise portions, e.g., edge portions that are disposed over a top surface of the IMD 106a, as shown in FIG. 2. In some embodiments, the contact pads 114 may comprise contacts of an under-ball metallization (UBM) structure or a post-passivation interconnect (PPI) structure. A conductive material such as solder balls, microbumps, controlled collapse chip connection (C4) bumps, or a combination thereof may later be attached to the contact pads 114 for electrical connection to the first semiconductor wafer 120a in some embodiments, as examples. In other embodiments, the contact pads 114 may comprise wire bond pads, and wire bonds may later be attached to the contact pads 114 for electrical connection to the first semiconductor wafer 120a, as another example. The contact pads 114 may alternatively comprise other types of contact pads, and other types of structures and techniques can be used to make electrical connections to the contact pads 114.

Figure 3:
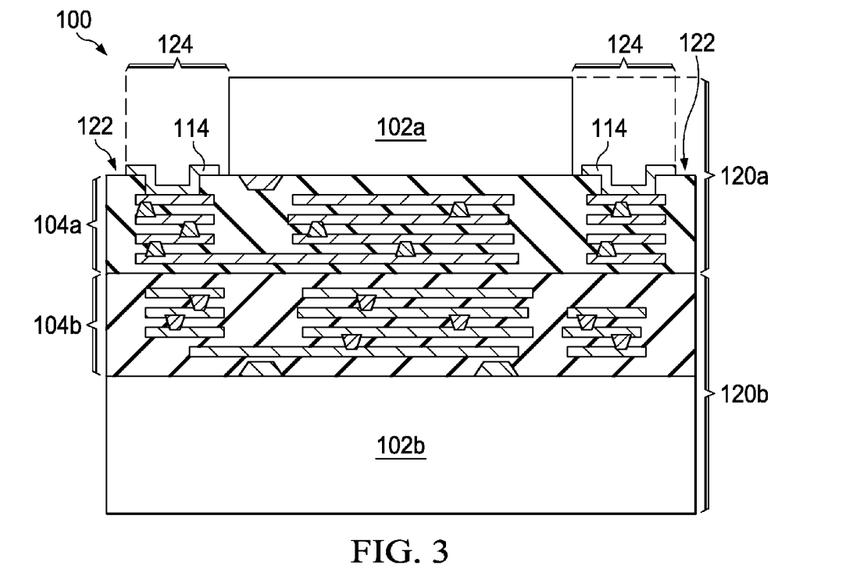
FIG. 3 is a cross-sectional view of the semiconductor device after a portion of a substrate of one of the semiconductor wafers has been removed in accordance with some embodiments.

FIG. 3 is a cross-sectional view of the semiconductor device 100 after a portion of a substrate 102a of one of the semiconductor wafers (e.g., the first semiconductor wafer 120a) has been removed in accordance with some embodiments. In accordance with some embodiments of the present disclosure, a portion of the substrate 102a is removed from the first semiconductor wafer 120a to expose a portion of the interconnect structure 104a. The portion of the substrate 102a removed comprises a portion of the substrate 102a that is: a) proximate a scribe line region 122, b) disposed over a contact pad 114 of the interconnect structure 104a, c) disposed over a plurality of the contact pads 114 of the interconnect structure 104a, d) disposed over a contact pad region 124 of the interconnect structure 104a, or a combination thereof a), b), c), and/or d), in accordance with some embodiments.

The portions of the first substrate 102a may be removed using a lithography process in some embodiments. For example, a layer of photoresist (not shown) may be deposited or formed over the first substrate 102a, and the layer of photoresist is then patterned using a lithography process. The lithography process may comprise exposing the layer of photoresist to light or energy transmitted through or reflected from a lithography mask having a desired pattern thereon. The layer of photoresist is developed, and exposed or unexposed portions of the layer of photoresist, depending on whether the layer of photoresist is a positive or negative photoresist, are ashed or etched away. The layer of photoresist is then used as an etch mask while portions of the substrate 102a are etched away using an etch process. A hard mask material (also not shown) may also be included between the substrate 102a and the layer of photoresist. The pattern in the layer of photoresist may be transferred to the hard mask material, and the hard mask, or both the layer of photoresist and the hard mask, may be used as an etch mask while portions of the substrate 102a are etched away using an etch process, as another example. Alternatively, the portions of the substrate 102a may be removed using other methods.

In some embodiments, the portions of the substrate 102a may be removed using a back side scribe line (BSSL) etch process or other etch process, for example. The portions of the substrate 102a are removed after the bonding process in some embodiments. In other embodiments, the portions of the substrate 102b may be removed from the first semiconductor wafer 120a before the bonding process (not shown in the drawings).

Figure 4:
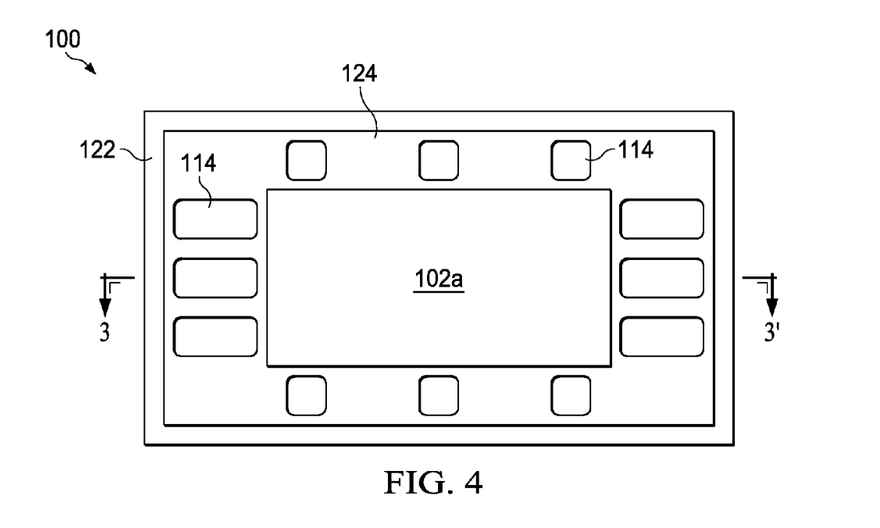
FIG. 4 is a top view of the semiconductor device shown in FIG. 3 in accordance with some embodiments.
Figure 5:
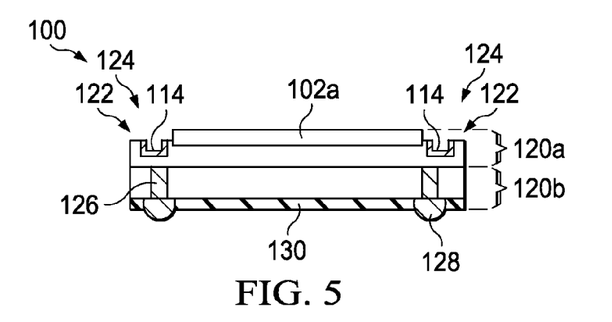
FIG. 5 is a cross-sectional view of a semiconductor device in accordance with some embodiments, wherein one of the semiconductor wafers includes through-vias formed therein.

In the embodiments shown in FIGS. 3 through 5, portions of the substrate 102a are removed from over the contact pad region 124 of the interconnect structure 104b and also from over the scribe line region 122 of the semiconductor device 100. The contact pad region 124 includes a plurality of the contact pads 114 and a region proximate the contact pads 114. For example, the contact pad region 124 comprises a shape of a frame in the top view shown in FIG. 4 that is spaced apart from sides of the contact pads 114 by a predetermined distance, such as a few μm to about 10 μm, as an example. Alternatively, the contact pad region 124 may be spaced apart from the sides of the contact pads 114 by other dimensions. The contact pad region 124 may be disposed around all of the contact pads 114 in some embodiments. In other embodiments, the contact pad region 124 is disposed around some of the contact pads 114. The substrate 102a is left remaining in a central region of the semiconductor device 100 in the embodiments shown; alternatively, the substrate 102a may be left remaining in other regions than the central region, and the contact pad region 124 may comprise other shapes.

FIG. 3 is a cross-sectional view of the semiconductor device 100 shown in FIG. 4 at view 3-3' of FIG. 4. The contact pads 114 are disposed in rows around the perimeter of the substrate 102a in some embodiments. Alternatively, the contact pads 114 may be arranged in other configurations. The scribe line region 122 is disposed at the edges of the semiconductor device 100. The scribe line region 122 comprises a region where a plurality of the semiconductor devices 100 will be separated from one another (e.g., singulated) from the first semiconductor wafer 120a and second semiconductor wafer 120b using a saw and/or laser to form individual semiconductor devices 100 that comprise the semiconductor chips 120a and 120b bonded together.

In the embodiments shown in FIG. 3, through-vias are not disposed in the second semiconductor wafer 120b. Electrical connections for the semiconductor device 100 may be made using the contact pads 114 which are exposed. For example, one end of a wire bond (not shown) may be connected to a contact pad 114 and an opposite end of the wire bond may be connected to a contact pad (also not shown) on a surface of the first substrate 102a. As another example, one end of a wire bond may be connected to a contact pad 114 and an opposite end of the wire bond may be connected to another external device (also not shown). Alternatively, electrical connection may be made to the contact pads 114 using other devices and techniques.

FIG. 5 is a cross-sectional view of a semiconductor device 100 in accordance with some embodiments. Portions of the substrate 102a are removed from over the contact pad region 124 of the interconnect structure 104b and also from over the scribe line region 122 of the semiconductor device 100, as shown in FIGS. 3 and 4. However, in the embodiments shown in FIG. 5, the second semiconductor wafer 120b includes a plurality of through-vias 126 formed therein. One or more through-vias 126 may be formed within the semiconductor device 120b that provide vertical electrical connections for the semiconductor device 100, for example. The through-vias 126 may be formed using a method described in patent application Ser. No. 13/839,860, filed on Mar. 15, 2013, entitled, "Interconnect Structure and Method," which application is hereby incorporated herein by reference, in some embodiments. Alternatively, other methods may be used to form the through-vias 126. The through-vias 126 may be formed by drilling or patterning apertures in the second semiconductor wafer 120b, lining the apertures with an insulating material, and filling the apertures with a conductive material, for example. The through-vias 126 may be formed before or after the bonding process for the semiconductor wafers 120a and 120b, in some embodiments.

The through-vias 126 extend at least partially through the second semiconductor wafer 120b and provide vertical electrical connections for the second semiconductor wafer 120b, e.g., from an upper layer to a bottom surface of the second semiconductor wafer 120b, or between the various material layers of the second semiconductor wafer 120b. In some embodiments, the through-vias 126 may extend through the second semiconductor wafer 120b to the first semiconductor wafer 120a and/or at least partially through the first semiconductor wafer 120a, providing vertical electrical connections between the first semiconductor wafer 120a and the second semiconductor wafer 120b.

Contact pads (not shown) may be coupled to the through-vias 126 so that electrical connection can be made to the bottom of the semiconductor device 100. In other embodiments, contact pads are not included, and electrical connections can be made to the through-vias 126 directly. In some embodiments, a conductive material 128 can be coupled to each of the plurality of through-vias 126 of the second semiconductor wafer 120b or to contact pads coupled to the through-vias 126. The conductive material 128 may comprise a eutectic material such as solder or other materials, for example. The conductive material 128 may comprise a solder ball, a microbump, a C4 bump, or a combination thereof. The conductive material 128 may alternatively comprise non-spherical connectors. In some embodiments, the conductive material 128 is not included on the semiconductor device 100.

The semiconductor device 100 may include an insulating material 130 disposed on a bottom surface of the second semiconductor wafer 120b, also shown in FIG. 5. The insulating material 130 may comprise a passivation layer and may comprise polyimide or other materials, for example. In some embodiments, an insulating material 130 is not included on the semiconductor device 100.

Note that in FIGS. 5 through 14, some of the elements shown in FIGS. 1 through 4 are not included or labeled, such as the interconnect structures 104a and 104b and the IMDs 106a and 106b. Reference can be made again to FIGS. 1 through 4 for more detailed views of portions of the first and second semiconductor wafers 120a and 120b.

Figure 6:
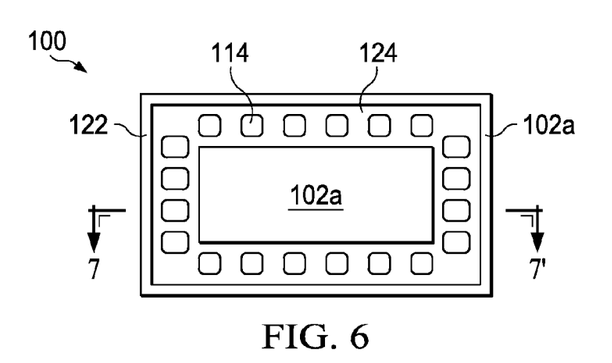
FIG. 6 is a top view and FIGS. 7 and 8 are cross-sectional views of a semiconductor device in accordance with some embodiments.
Figure 7:
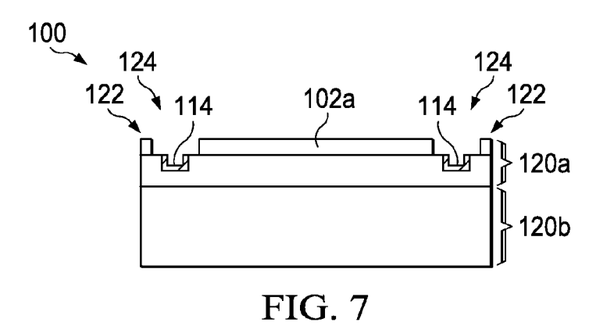
Figure 8:
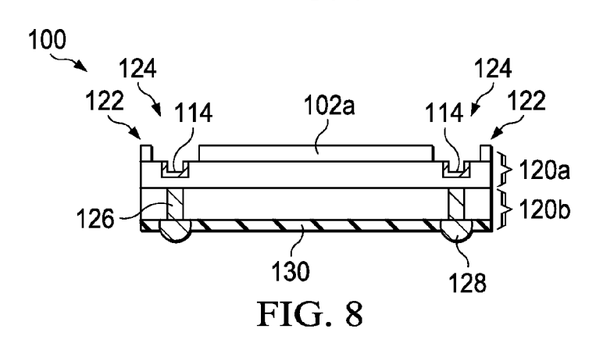

FIG. 6 is a top view and FIGS. 7 and 8 are cross-sectional views of a semiconductor device 100 in accordance with some embodiments. The substrate 102a is removed from over the contact pad region 124 of the interconnect structure 104a in these embodiments. The substrate 102a is left remaining over the scribe line region 122 and a central region of the semiconductor device 100, for example. FIG. 7 is a cross-sectional view of the semiconductor device 100 at view 7-7' of FIG. 6. FIG. 8 illustrates some embodiments similar to the embodiment shown in FIG. 5 wherein through-vias 126 are formed in the second semiconductor wafer 120b, and a conductive material 128 and an insulating material 130 may or may not be included on the semiconductor device 100.

Figure 9:
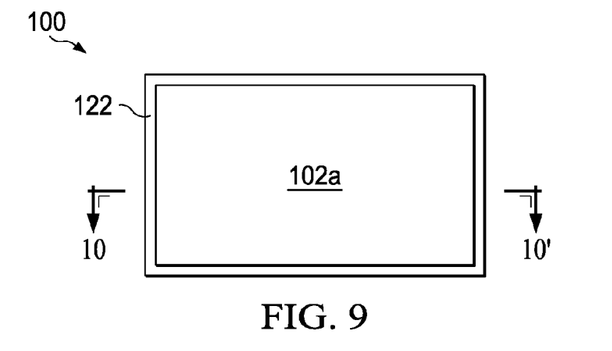
FIG. 9 is a top view and FIG. 10 is a cross-sectional view of a semiconductor device in accordance with some embodiments.
Figure 10:
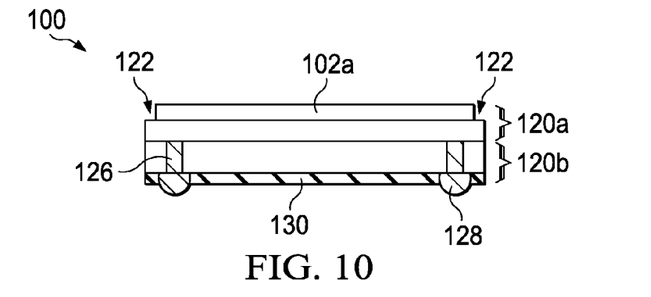

FIG. 9 is a top view and FIG. 10 is a cross-sectional view of a semiconductor device 100 in accordance with some embodiments. Portions of the substrate 102a are removed only from over the scribe line region 122 of the semiconductor device 100. The substrate 102a is left remaining over the contact pads 114 and the contact pad regions 124 (not shown in FIGS. 9 and 10; see FIGS. 4 and 6). Because the contact pads 114 and contact pad regions 124 remain covered by the substrate 102a and cannot be used for electrical connections in these embodiments, through-vias 126 are included in the semiconductor device 100 as shown in FIG. 10 that extend partially through the second semiconductor wafer 120b, fully through the second semiconductor wafer 120b, or fully through the second semiconductor wafer 120b and at least partially through the first semiconductor wafer 120a, in some embodiments. A conductive material 128 and an insulating material 130 may or may not be included on the semiconductor device 100, as described for the embodiments shown in FIGS. 5 and 8.

Figure 11:
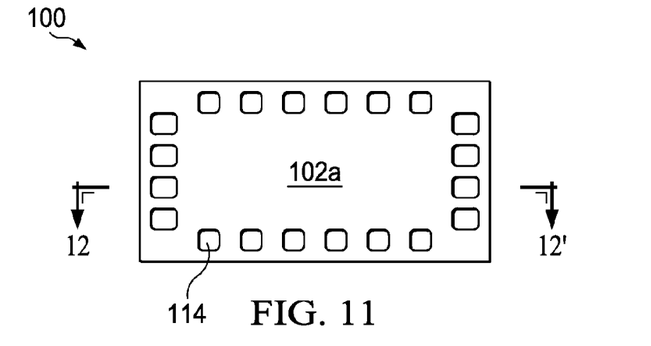
FIG. 11 is a top view and FIG. 12 is a cross-sectional view of a semiconductor device in accordance with some embodiments.
Figure 12:
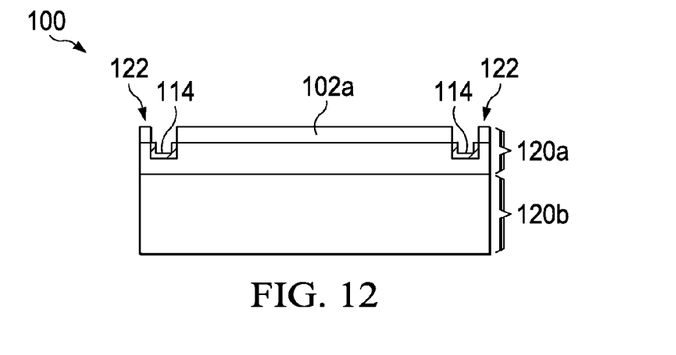

FIG. 11 is a top view and FIG. 12 is a cross-sectional view of a semiconductor device 100 in accordance with some embodiments. Portions of the substrate 102a are removed only from over the contact pads 114 in these embodiments. The substrate 102a is left remaining over the scribe line region 122 of the semiconductor device 100, for example. The substrate 102a is removed from directly over at least a portion of the contact pads 114 in some embodiments.

Figure 13:
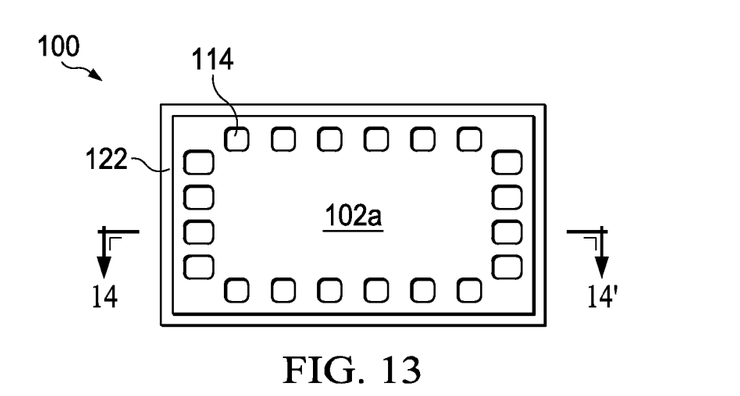
FIG. 13 is a top view and FIG. 14 is a cross-sectional view of a semiconductor device in accordance with some embodiments.
Figure 14:
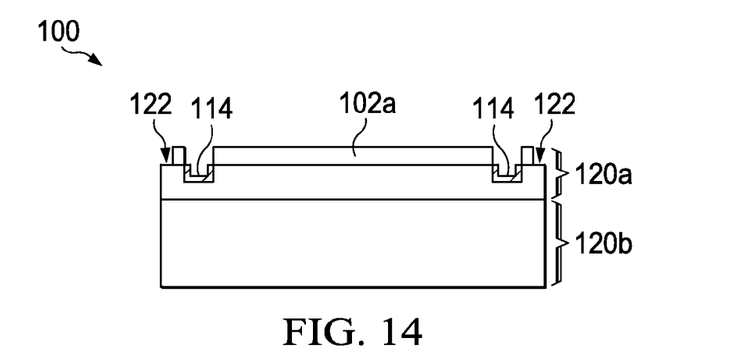

FIG. 13 is a top view and FIG. 14 is a cross-sectional view of a semiconductor device 100 in accordance with some embodiments. Portions of the substrate 102a are removed from over the contact pads 114 of the interconnect structure 104b and also from over the scribe line region 122 of the semiconductor device 100.

In the embodiments shown in FIGS. 11 through 14, portions of the substrate 102a can be removed from over all of the contact pads 114 of the interconnect structure 104a, or portions of the substrate 102a can be removed from over one or some of the contact pads 114 of the interconnect structure 104a, for example. A portion of the substrate 102a may be left remaining over the contact pads 114, e.g., in the edge regions of the contact pads 114, in some embodiments, not shown.

The embodiments shown in FIGS. 9 through 14 may also include through-vias 126 formed in the second semiconductor wafer 120b in some embodiments, for example, as shown in FIGS. 5, 8, and 10. A conductive material 128 and/or insulating material 130 may also be included on the second semiconductor wafer 120b, for example, or the conductive material 128 and/or insulating material 130 may not be included on the second semiconductor wafer 120b.

After the semiconductor wafers 120a and 120b are bonded together and a portion of the first substrate 102a is removed from the first semiconductor wafer 120a, the semiconductor device 100 (e.g., the bonded semiconductor wafers 120a and 120b) are singulated along the scribe lines in the scribe line region 122 to form a plurality of devices. The plurality of devices comprises a plurality of image sensor devices in some embodiments. In some embodiments, the scribe line region 122 is removed from the devices completely during the singulation process. In other embodiments, a portion of the scribe line region 122 is left remaining after the singulation process on the devices. After the singulation process, the portion of the first semiconductor wafer 120a in each device is also referred to herein as a first semiconductor chip 120a, and the portion of the second semiconductor wafer 120b in each device is also referred to herein as a second semiconductor chip 120b, e.g., in some of the claims.

Figure 15:
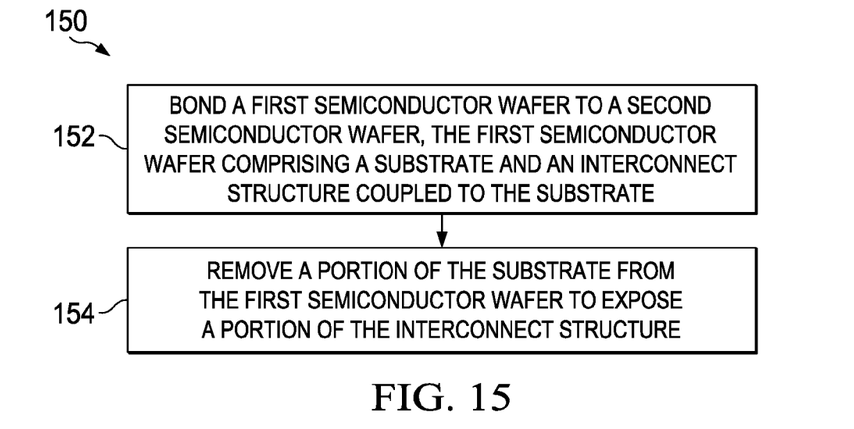
FIG. 15 is a flow chart of a method of manufacturing a semiconductor device in accordance with some embodiments of the present disclosure.

FIG. 15 is a flow chart 150 of a method of manufacturing a semiconductor device 100 (see also FIGS. 1 through 3) in accordance with some embodiments of the present disclosure. In step 152, a first semiconductor wafer 120a is bonded to a second semiconductor wafer 120b, the first semiconductor wafer 120a comprising a substrate 102a and an interconnect structure 104a coupled to the substrate 102a. In step 154, a portion of the substrate 102a is removed from the first semiconductor wafer 120a to expose a portion of the interconnect structure 104a.

Some embodiments of the present disclosure include methods of manufacturing semiconductor devices and images sensor devices. Some embodiments of the present disclosure also include semiconductor devices and image sensor devices that have been manufactured using the novel methods described herein.

Advantages of some embodiments of the disclosure include providing novel semiconductor devices 100 and image sensor devices 100 that include two semiconductor chips 120a and 120b bonded together that may include a variety of interconnect configurations and selections. The image sensor devices 100 comprise stacked CIS devices in some embodiments that integrate semiconductor chips 120a and 120b with different characteristics into a single semiconductor device 100 or image sensor device 100. Optimal manufacturing processes may be used to separately manufacture the first semiconductor chip 120a and the second semiconductor chip 120b, and then the semiconductor chips 120a and 120b are bonded together. Portions of the substrate 102a are removed to expose contact pads 114 in some embodiments, so that the contact pads 114 can be used for making electrical connections, which reduces metal routing and chip area required, in some embodiments. The novel manufacturing methods described herein provide a flexible application that results in lower power consumption and increased operation speeds, in some embodiments. The various embodiments of the present disclosure provide a variety of configurations and appearances of semiconductor devices 100. Furthermore, the novel semiconductor device 100 and image sensor device 100 structures and designs are easily implementable in manufacturing process flows.

In accordance with some embodiments of the present disclosure, a method of manufacturing a semiconductor device includes bonding a first semiconductor wafer to a second semiconductor wafer, the first semiconductor wafer comprising a substrate and an interconnect structure coupled to the substrate. A portion of the substrate is removed from the first semiconductor wafer to expose a portion of the interconnect structure.

In accordance with other embodiments, a method of manufacturing an image sensor device includes bonding a first semiconductor wafer to a second semiconductor wafer, the first semiconductor wafer comprising a substrate and an interconnect structure coupled to the substrate. A portion of the substrate is removed to expose a portion of the interconnect structure. The first semiconductor wafer and the second semiconductor wafer are singulated to form a plurality of image sensor devices.

In accordance with other embodiments, an image sensor device includes a first semiconductor chip, the first semiconductor chip including a substrate and an interconnect structure disposed over the substrate. The image sensor device includes a second semiconductor chip bonded to the first semiconductor chip. A portion of the interconnect structure of the first semiconductor chip is exposed.

In some embodiments, the exposed portion of the interconnect structure of the first semiconductor chip comprises a region of the image sensor device proximate a scribe line region, a contact pad of the interconnect structure, a plurality of contact pads of the interconnect structure, a contact pad region of the interconnect structure, and combinations thereof.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A method of manufacturing a semiconductor device, the method comprising:
bonding a first semiconductor wafer to a second semiconductor wafer, the first semiconductor wafer comprising a substrate and an interconnect structure coupled to the substrate, a bottommost surface of the interconnect structure not extending below a topmost surface of the substrate, the interconnect structure comprising a plurality of insulating layers and a plurality of conductive layers, a conductive layer in a first portion of the interconnect structure being a contact pad of the interconnect structure, the contact pad contacting the topmost surface of the substrate, the contact pad having a first surface coplanar with the bottommost surface of the interconnect structure; and removing a first portion of the substrate from the first semiconductor wafer to expose the first surface of the contact pad in the first portion of the interconnect structure; and removing a second portion of the substrate from the first semiconductor wafer over a scribe line region to expose a second portion of the interconnect structure.

2. The method according to claim 1, wherein removing the first portion of the substrate comprises removing the portion from over a contact pad region of the interconnect structure.

3. The method according to claim 1, wherein the substrate comprises a first substrate, wherein the interconnect structure comprises a first interconnect structure, wherein the second semiconductor wafer comprises a second substrate and a second interconnect structure disposed over the second substrate, and wherein bonding the first semiconductor wafer to the second semiconductor wafer comprises bonding the first interconnect structure to the second interconnect structure.

4. The method according to claim 1, wherein the first semiconductor wafer comprises a sensor chip including a pixel array region disposed in the substrate.

5. The method according to claim 4, wherein the first semiconductor wafer includes a color filter material disposed over the pixel array region, and a lens material disposed over the color filter material.

6. A method of manufacturing an image sensor device, the method comprising:
    forming a first semiconductor wafer, the forming the first semiconductor wafer comprising;
    forming an interconnect structure on a substrate, a bottommost surface of the interconnect structure contacting a topmost surface of the substrate, the substrate comprising a central region immediately surrounded by an outer region, the central region comprising a pixel array region disposed in the substrate, the interconnect structure comprising a stack of interconnect layers, the stack extending from the topmost surface of the substrate, a first conductive portion of the interconnect structure contacting the topmost surface of the substrate, the first conductive portion of the interconnect structure having a first surface coplanar with the bottommost surface of the interconnect structure;
    after forming the first semiconductor wafer, bonding the first semiconductor wafer to a second semiconductor wafer;
    removing the outer region of the substrate to expose at least the first conductive portion of the interconnect structure outside the central region; and
    singulating the first semiconductor wafer and the second semiconductor wafer to form a plurality of image sensor devices.

7. The method according to claim 6, wherein removing the outer region of the substrate comprises removing the substrate proximate a scribe line region, from over a contact pad of the interconnect structure, from over a plurality of contact pads of the interconnect structure, and from over a contact pad region of the interconnect structure.

8. The method according to claim 6, wherein bonding the first semiconductor wafer to the second semiconductor wafer comprises a dielectric-to-dielectric bond, a metal-to-metal bond, a metal-to-dielectric bond, or a combination thereof.

9. The method according to claim 6, further comprising inverting the first semiconductor wafer, before bonding the first semiconductor wafer to the second semiconductor wafer.

10. The method according to claim 6, wherein the second semiconductor wafer includes a plurality of through-vias formed therein.

11. The method according to claim 10, further comprising coupling a conductive material to each of the plurality of through-vias of the second semiconductor wafer.

12. The method according to claim 11, wherein coupling the conductive material comprises coupling a solder ball, a microbump, a controlled collapse chip connection (C4) bump, or a combination thereof.

13. An image sensor device, comprising:
    a first semiconductor chip, the first semiconductor chip including a first substrate and a first interconnect structure disposed over the first substrate, the first interconnect structure having a topmost surface and a bottommost surface, the topmost surface being distal the first substrate and the bottommost surface contacting a topmost surface of the first substrate; and
    a second semiconductor chip bonded to the first semiconductor chip in a face to face configuration, the second semiconductor chip including a second interconnect structure and a conductive through via extending from a face surface of the second semiconductor chip through the second semiconductor chip to a back surface of the second semiconductor chip and electrically connecting the first interconnect structure to an external connector on a back side of the second semiconductor chip, a layer of the first interconnect structure of the first semiconductor chip being exposed through the first substrate, the layer being proximate the first substrate relative to at least one other layer of the first interconnect structure, a first exposed portion of the layer including a conductive portion of the first interconnect structure and a second exposed portion of the layer being a scribe line region, the conductive portion of the first exposed portion of the layer having a surface coplanar with the bottommost surface of the first interconnect structure.

14. The image sensor device according to claim 13, wherein the first exposed portion of the layer of the first interconnect structure of the first semiconductor chip comprises a plurality of contact pads of the first interconnect structure.

15. The image sensor device according to claim 13, wherein the second semiconductor chip includes the second interconnect structure coupled to a second substrate, and wherein conductive features, conductive lines, conductive vias, or shallow trench isolation (STI) regions in the first interconnect structure comprise an opposite shape from conductive features, conductive lines, conductive vias, or shallow trench isolation (STI) regions in the second interconnect structure.

16. The image sensor device according to claim 13, wherein the first semiconductor chip comprises a sensor chip, and wherein the second semiconductor chip comprises an application specific integrated circuit (ASIC) chip.

17. The image sensor device according to claim 13, wherein the image sensor device comprises a stacked complementary metal oxide semiconductor (CMOS) image sensor (CIS) device.

18. The image sensor device according to claim 13, wherein the image sensor device comprises a back side illumination (BSI) image sensor device.

* * * * *